United States Patent
Wang et al.

(10) Patent No.: US 6,483,045 B1
(45) Date of Patent: Nov. 19, 2002

(54) VIA PLUG LAYOUT STRUCTURE FOR CONNECTING DIFFERENT METALLIC LAYERS

(75) Inventors: Mu-Chun Wang, Hsinchu Hsien (TW); Shih-Chieh Kao, Hsinchu (TW); Shiang Huang-Lu, Hsinchu (TW); Yuan-Chang Liu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 43 days.

(21) Appl. No.: 09/626,409

(22) Filed: Jul. 26, 2000

(30) Foreign Application Priority Data

Feb. 3, 2000 (TW) ......................... 89101955 A

(51) Int. Cl.[7] ................................. H05K 1/11
(52) U.S. Cl. .................. 174/264; 174/262; 361/780; 361/792
(58) Field of Search ............... 174/262, 263, 174/264, 265, 260; 361/792, 793, 794, 795, 780, 784, 803; 257/698, 669; 333/246

(56) References Cited

U.S. PATENT DOCUMENTS

| | | | | |
|---|---|---|---|---|
| 3,760,302 A | * | 9/1973 | Cohn | .................. 333/73 R |
| 4,628,406 A | * | 12/1986 | Smith et al. | ................. 361/386 |
| 4,965,702 A | * | 10/1990 | Lott et al. | .................... 361/401 |
| 5,012,047 A | * | 4/1991 | Dohya | ......................... 174/250 |
| 6,239,669 B1 | * | 5/2001 | Koriyama et al. | ............. 333/26 |
| 6,271,483 B1 | * | 8/2001 | Horiuchi et al. | ............ 174/265 |

* cited by examiner

Primary Examiner—Kamand Cuneo
Assistant Examiner—José H. Alcala
(74) Attorney, Agent, or Firm—Charles C.H. Wu; Wu & Cheung, LLP

(57) ABSTRACT

A via plug layout structure for connecting different metallic layers. The structure includes a plurality of via plugs arranged in a fan-shaped pattern and a plurality of empty bars positioned between a single via plug and the fanned-out via plugs so that incoming current to the single via plug is equally distributed to every one of the fanned-out via plug and current stress in each fanned-out via plug is identical. Hence, via plugs having particularly serious electromigration problem can be discovered. In addition, single via plug having different critical dimension can be fabricated so that maximum critical dimension sustainable by the via plug is determined after an electromigration test.

12 Claims, 4 Drawing Sheets

VIA PLUG LAYOUT STRUCTURE FOR CONNECTING DIFFERENT METALLIC LAYERS

CROSS-REFERENCE TO RELATED APPLICATION

This application claims the priority benefit of Taiwan application serial no. 89101955, filed Feb. 3, 2000.

BACKGROUND OF THE INVENTION

1. Field of the Invention

The present invention relates to a via-plug layout structure for connecting different metallic layers. More particularly, the present invention relates to a method of connecting different metallic layers by arranging a plurality of empty bars and a plurality of via plugs at fan-shaped positions so that the most stressful location due to electromigration can be determined.

2. Description of the Related Art

Following recent advances in semiconductor manufacturing technologies, devices having deep submicron dimensions can now be fabricated. As the level of integration continue to increase, there is insufficient surface area to accommodate all the interconnecting lines. Hence, more than one layer of interconnects, known as multilevel interconnects design, are often needed in very large-scale integrated (VLSI) circuits. In addition, some of the metallic layers need to be connected. To interconnect metallic layers at different levels, a via hole is formed in the intervening dielectric layer and conductive material is deposited inside the via hole.

At present, most devices in a VLSI circuit are interconnected using more than one interconnect metallic layer. The purpose of having multiple interconnects is to form a wiring line structure that can accommodate the connections due to an increase in device density. In deep submicron integrated circuits, since the level of integration is increased, production yield and reliability of interconnects may deteriorate.

Due to the increase in the level of integration for integrated circuits, dimension of interconnects and via plug or metallic plug is reduced correspondingly. Therefore, area of contact between via plug and interconnect is also reduced. Area of contact is further reduced if there is any misalignment in the process of forming the via plug by photolithographic and etching operation. When area of contact between the via plug and the interconnect is greatly reduced, electric current flowing through the area results in a very high local current density. Localized high current density may lead to electromigration (EM), and an open circuit may result if electromigration persists. Electromigration (EM) occurs when the internal metallic crystals inside a conductive wire are bombarded by too many electrons so that originally bonded crystals are forced to separate. Once electromigration occurs inside a conductive line, reliability of the electronic product is likely to deteriorate.

FIG. 1 is a schematic top view showing a conventional method of laying via plugs to connect different metallic layers.

As shown in FIG. 1, labels 100a–100c represent sections of a first metallic layer while labels 102a and 102b represent sections of a second metallic layer, and labels 104a–104d represent four via plugs. The via plugs 104a–104d electrically connect different sections of the first metallic layer 100a–100c with different sections of the second metallic layer 102a and 102b. For example, the via plug 104a electrically connects section 100a of the first metallic layer 100a with section 102a of the second metallic layer.

If a current flows in from section 100a of the first metallic layer, a current stress is created. The current passes through via plug 104a, section 102a, via plug 104b and finally into section 100b of the first metallic layer. The electric current may continue to flow into via plug 104c, section 102b of the second metallic layer and via plug 104d, and finally reach section 100c of the first metallic layer.

The via plugs 104a 104d are connected one-by-one. Therefore, an incoming current flows through each via plug in sequence. Any via plug that has an overly high resistance so as to fail is unlikely to be discovered in an electromigration (EM) test. Hence, it is very difficult to assess the reliability of various via plugs 104a–104d by performing an electromigration test using the conventional via plug configuration as shown in FIG. 1.

SUMMARY OF THE INVENTION

Accordingly, one object of the present invention is to provide a via plug layout structure for via plugs that links different metallic layers and is capable of finding the failed via plug in an electromigration test.

To achieve these and other advantages and in accordance with the purpose of the invention, as embodied and broadly described herein, the invention provides a via plug layout structure for via plugs that links different metallic layers. The via plug layout structure includes a first metallic layer, a second metallic layer, a third metallic layer, a dielectric layer, a first via plug, a plurality of second via plugs and a plurality of empty bars. The dielectric layer is formed over the first and third metallic layer. The first via plug is formed through the dielectric layer to electrically connect to the first metallic layer. The second metallic layer is formed over the dielectric layer and is electrically connected to the first via plug. The plurality of second via plugs are arranged in a fan-shaped pattern through the dielectric layer. The second via plugs are electrically connected to the second metallic layer. Each second via plug is at an identical distance away from the first via plug. The third metallic layer is electrically connected to the second via plugs. The empty bars are positioned in an upper surface of the second metallic layer between the first via plug and the plurality of second via plugs. The empty bars are used to divert incoming current. The number of empty bars employed is preferably the same as the number of second via plugs. Moreover, each empty bar is preferably positioned at the same distance from both the first via plug and the second via plug so that more accurate electromigration tests can be conducted.

Generally speaking, the first metallic layer, the second metallic layer, the first via plug and a second plug are taken as an example. Then empty bars are positioned above the first metallic layer. The first via plug is a single structure and the second via plugs are a fan-shaped pattern. The size of the first via plug is varied to a size, for example, 20% of a via plug size. The electromigraion affected by a process deviation can be observed. The fail via plug can be determined using the combination of voltage contrast, optical microscoped, and conductivity measurement.

The via plug layout structure for connecting different metallic layers in this invention includes a plurality of via plugs arranged into a fan-shaped pattern. The structure further includes a plurality of empty bars positioned between a single via plug and each fanned-out via plug so that current is equally distributed among each of the fanned-out via plugs. Since stress current resulting from current flowing from the single via plug to each of the fanned-out via plug is identical, location where electromigration is most serious can be determined more accurately. Furthermore, single via plugs having different critical dimensions can be fabricated so that the ultimate critical dimension sustainable by the via plug can be obtained after an electromigration test.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
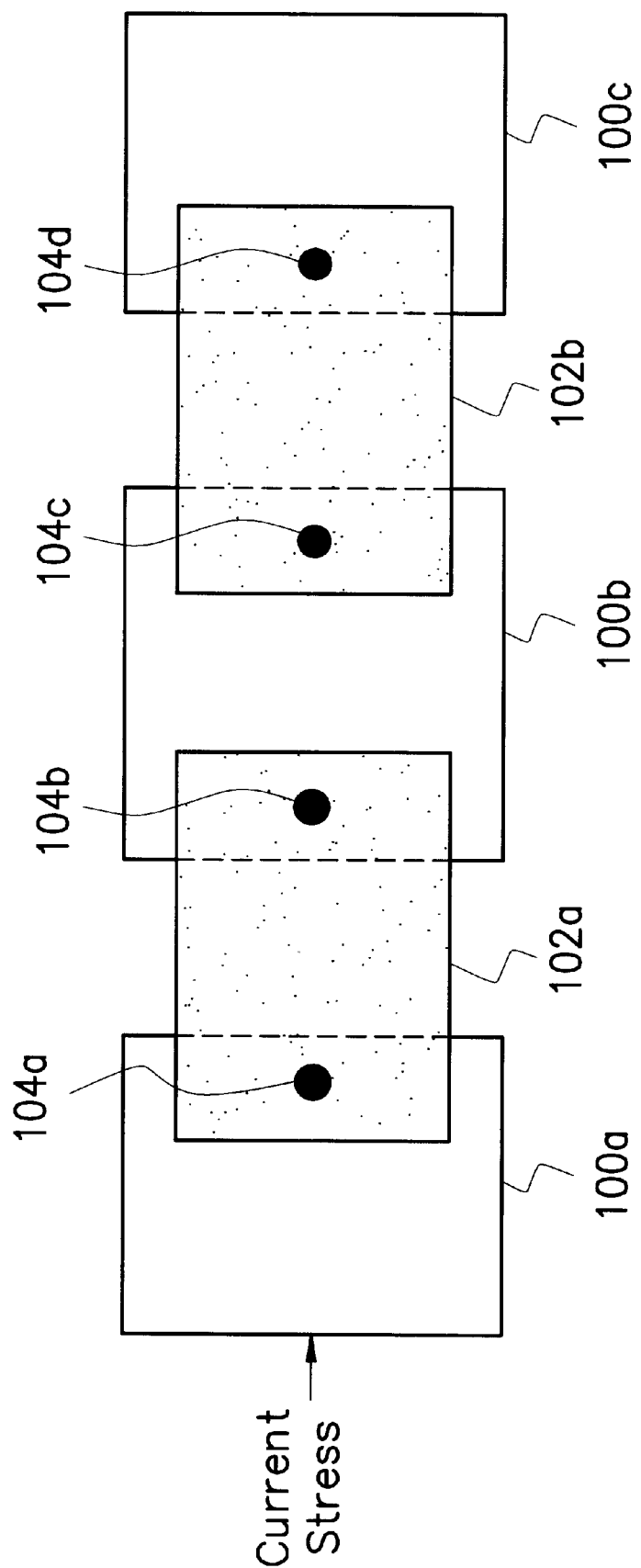
FIG. 1 is a schematic top view showing a conventional method of laying via plugs to connect different metallic layers.

Reference will now be made in detail to the present preferred embodiments of the invention, examples of which are illustrated in the accompanying drawings. Wherever possible, the same reference numbers are used in the drawings and the description to refer to the same or like parts.

Figure 2:
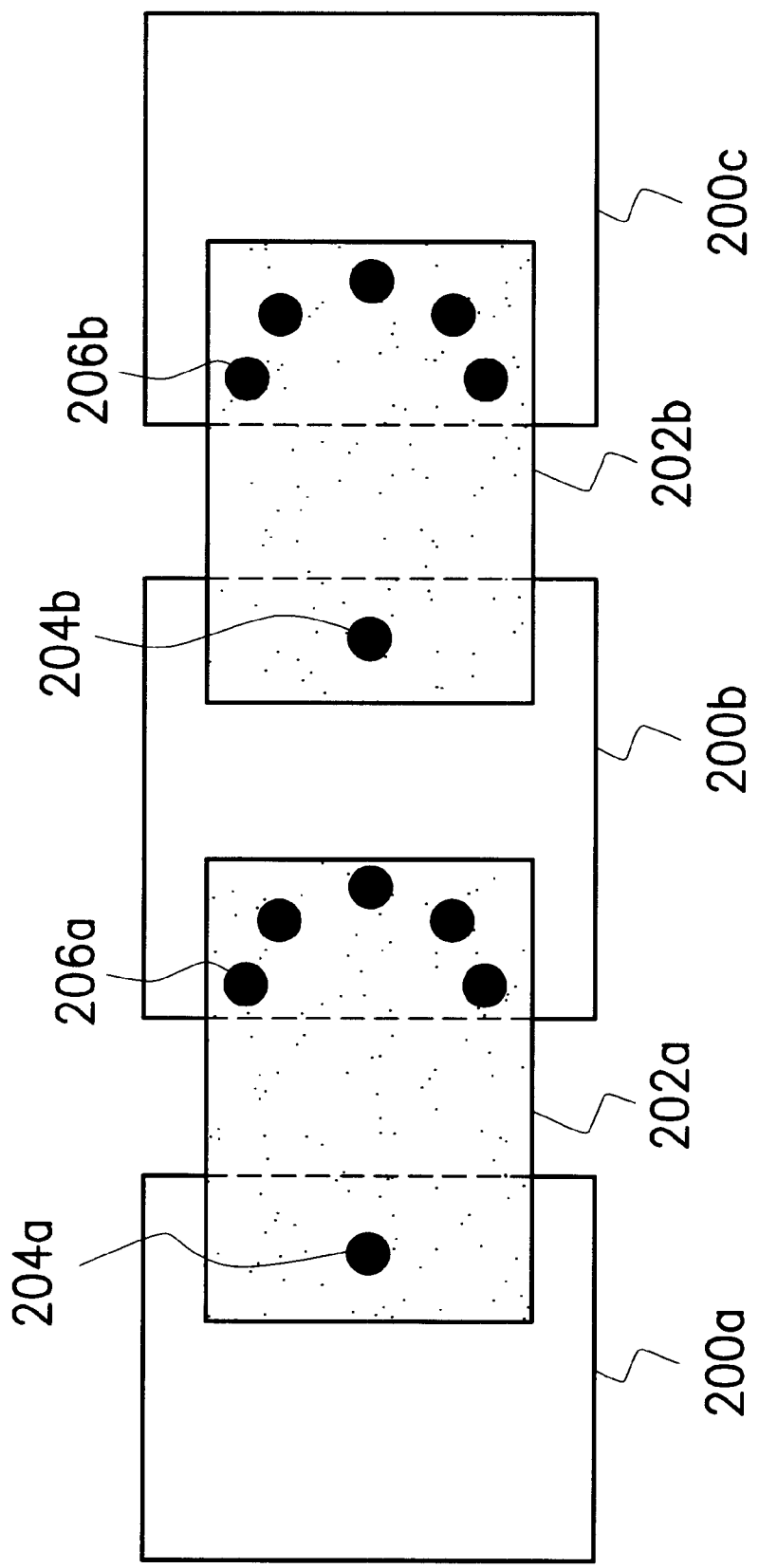
FIG. 2 is a schematic top view showing a via plug structural layout for connecting different metallic layers according to a first preferred embodiment of this invention.
Figure 4:
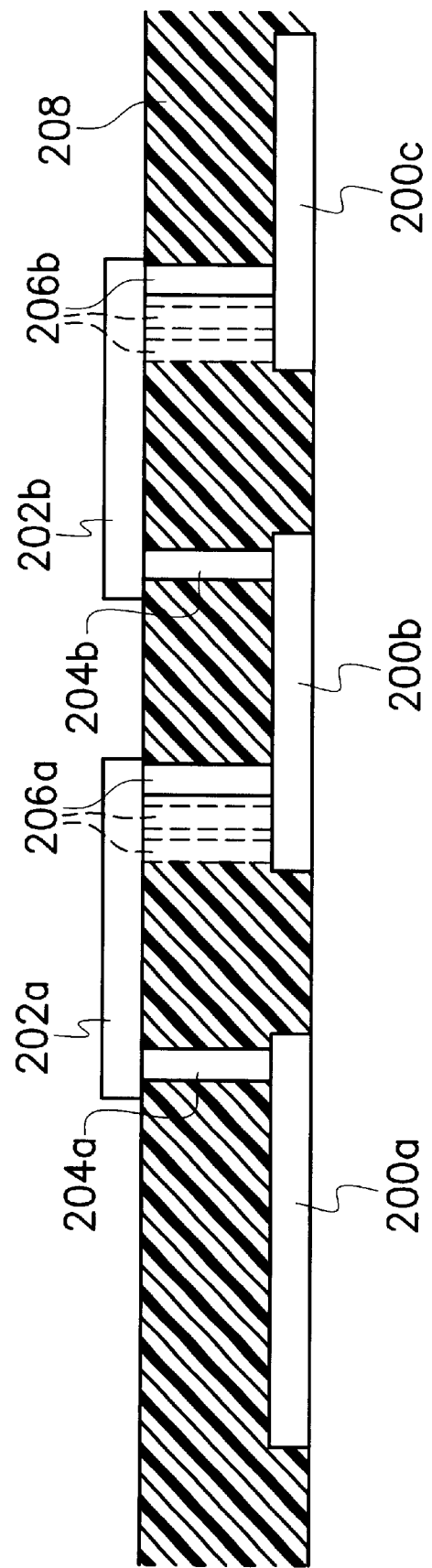
FIG. 4 is a sectional view of FIG. 2.

FIG. 2 is a schematic top view showing a structural layout of via plugs for connecting different metallic layers according to a first preferred embodiment of this invention. FIG. 4 is a schematic sectional view of FIG. 2.

In FIG. 2 and FIG. 4, labels 200a–200c represents various sections of a first metallic layer, labels 202a and 202b represent sections of the second metallic layer and labels 204a, 204b, 206a and 206b represent via plugs. The via plugs 204a, 204b, 206a and 206b are formed through the dielectric layer 208 in a manner to connect to various sections of the first metallic layers 200a200c and the second metallic layer 202a and 202b. For example, the via plug 204a electrically connects section 200a of the first metallic layer and section 202a of the second metallic layer. For the sake of clearer illustration of the invention, the dielectric layer 208 is not represented in the top view.

Note that in the embodiment of this invention the label 206a or 206b actually refers to a set of five via plugs positioned in a fan-shaped pattern as shown in FIG. 2. The number of via plugs in each via plug set 206a or 206b can be more than five, for example, as ten or more. The number of via plugs in via plug set 206a and in via plug set 206b can be different, too. For example, the number of via plugs in via plug set 206a can be five while the number of via plugs in via plug set 206b can be ten.

In addition, it should also be noted that critical dimensions (CD) of via plug 204a and via plug 204b can be different. For example, the critical dimension of via plug 204a can be 0.3 μm while the critical dimension of via plug 204b can be 0.27 μm. With this arrangement, attainable critical dimension can be obtained after an electromigration test. Each via plug of the via plug set 206a is at a distance away from the single via plug 204a, preferably an identical distance.

Figure 3:
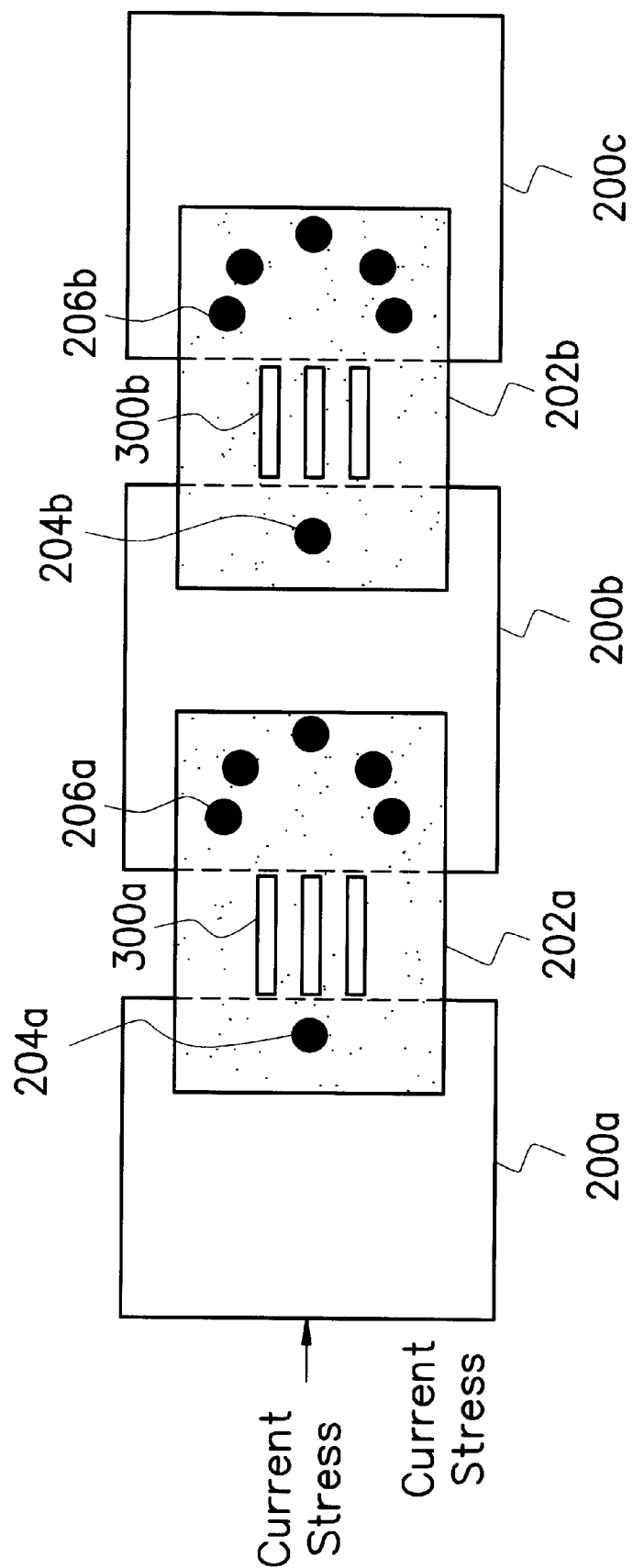
FIG. 3 is a schematic top view showing a via plug structural layout for connecting different metallic layers according to a second preferred embodiment of this invention.

FIG. 3 is a schematic top view showing a structural layout of via plugs for connecting different metallic layers according to a second preferred embodiment of this invention.

The structural layout of via plugs in FIG. 3 is very similar to the one in FIG. 2. Their main difference is the introduction of a plurality of empty bars 300a in section 202a of the second metallic layer between the via plug 204a and the via plug set 206a and a plurality of empty bars 300b in section 202b of the second metallic layer 202a between the via plug 204b and the via plug set 206b. The empty bars 300a and 300b are used to divert electric current. Only three empty bars are shown in the surface of sections 202a and 202b of the second metallic layer. However, an empty bar 300a is preferably positioned between a single via plug such as the via plug 204a and each via plug of the via plug set 206a. In addition, these empty bars 300a are preferably positioned at equal distance away from the single via plug 204a and the via plugs of the via plug set 206a, respectively, so that better results can be obtained from the electromigration test.

When a current flows in from section 200a of the first metallic layer, the current passes through via plug 204a into section 202a of the second metallic layer. The current is then diverted by empty bars 300a into various via plugs of via plug set 206a.

Finally, the current passes through section 200b of the first metallic layer and via plug 204b into section 202b of the second metallic layer.

Electromigration (EM) of a via plug can be described by Black's formula: $\tau = A \cdot J^{-n} \cdot \exp(Ea/kT)$; wherein "$\tau$" represents lifetime of the via plug, "A" represents a constant, "J" represents current density, "n" represents an acceleration factor due to an electric current, "Ea" represents an activation energy, "k" represents a Boltzmann constant, and "T" represents a absolute temperature.

According to Black's formula, the electromigration lifetime $\tau$ of a via plug is proportional to $J^{-n}$. If multiple via plugs, such as ten, are used to form a fan-shaped pattern, current flowing into a single via plug is ten times the current flowing into each fanned-out via plug. Hence, electromigration (EM) occurs much faster in the single via plug. For example, if n=2, life span of each fanned-out via plug in the fan-shaped structure is about 100 times longer than that of a single via plug. Hence, if there is any failure in an EM test, the failure must occur in a single via plug.

In addition, since the distance from each via plug of the via plug set 206a to the single via plug 204a are identical, the same current flows from the single via plug 204a to each via plug of the via plug set 206a. Because each via plug of the via plug set 206a is subjected to the same stress current, the most serious EM stress is exerted on single via plugs rather than on via plugs in the via plug set. Hence, reliability of via plugs with respect to EM stress can-be accurately determined.

In summary, the advantages of this invention include:
(1) By forming fanned-out via plugs so that a current flowing out from a single via plug is diverted to various fanned-out via plugs, via plugs having the most serious EM stress can be reliably determined.
(2) By forming single via plugs having different critical dimensions, actual critical dimension sustainable by a via plug subjected to EM stress can be obtained.

(3) By forming a plurality of empty bars between a single via plug and the via plugs of a via plug set, current is equally diverted to each via plug of the via plug set. Hence, each of the fanned-out via plug is subjected to an identical current stress.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A via plug layout structure to connect different metallic layers, comprising:
   a first metallic layer;
   a third metallic layer;
   a dielectric layer, formed over the first and third metallic layers;
   a first via plug, formed through the dielectric layer and electrically connected to the first metallic layer;
   a second metallic layer, formed over the dielectric layer and electrically connected to the first via plug; and
   a plurality of second via plugs, arranged through the dielectric layer in a fan-shaped pattern radially away from the first via plug, and electrically connected to the second and third metallic layers.

2. The via plug layout structure of claim 1, wherein each second via plug is separated from the first via plug by an identical distance.

3. The via plug layout structure of claim 1, wherein the third metallic layer is another section of the first metallic layer.

4. A via plug layout structure to connect different metallic layers, comprising:
   a first metallic layer;
   a third metallic layer;
   a dielectric layer, formed over the first metallic layer and the third metallic layer;
   a first via plug, formed through the dielectric layer and electrically connected to the first metallic layer;
   a second metallic layer, formed over the dielectric layer and electrically connected to the first via plug;
   a plurality of second via plugs, arranged through the dielectric layer in a fan-shaped pattern radially away from the first via plug, and electrically connected to the second and third metallic layers, wherein each second via plug is located at a first distance away from the first via plug; and
   a plurality of first empty bars, positioned in an upper surface of the second metallic layer between the first via plug and the second via plugs to divert incoming current.

5. The via plug layout structure of claim 4, wherein the first empty bars and the second via plugs are about equal in number, and each first empty bar is placed at an identical distance away from both the first via plug and a corresponding second via plug.

6. The via plug layout structure of claim 4, wherein the structure further includes:
   a fourth metallic layer over the dielectric layer;
   a third via plug, formed through the dielectric layer and electrically connected to the third metallic layer and the fourth metallic layer; and
   a plurality of fourth via plugs, arranged through the dielectric layer in a fan-shaped pattern radially away from the third via plug, and electrically connected to the fourth metallic layer, wherein each fourth via plug is at a second distance away from the third via plug.

7. The via plug layout structure of claim 6, wherein the structure further includes a plurality of second empty bars positioned in an upper surface of the fourth metallic layer between the third via plug and the fourth via plugs to divert incoming current.

8. The via plug layout structure of claim 7, wherein the second empty bars and the fourth via plugs are equal in number, and each second empty bar is placed at an identical distance away from both the third via plug and a corresponding fourth via plug.

9. The via plug layout structure of claim 6, wherein each fourth via plug is separated from the third via plug by an identical second distance.

10. The via plug layout structure of claim 6, wherein the fourth via plugs and the second via plugs are different in number.

11. The via plug layout structure of claim 6, wherein a critical dimension of the third via plug is different from a critical dimension of the first via plug.

12. The via plug layout structure of claim 6, wherein the fourth metallic layer is a section of the second metallic layer.

* * * * *